United States Patent [19]

Skinner et al.

[11] 3,933,644
[45] Jan. 20, 1976

[54] SPUTTER COATING APPARATUS HAVING IMPROVED TARGET ELECTRODE STRUCTURE

[75] Inventors: James R. Skinner, Cupertino; Albert Lang, Jr., Palo Alto, both of Calif.

[73] Assignee: Varian Associates, Palo Alto, Calif.

[22] Filed: May 24, 1973

[21] Appl. No.: 363,449

Related U.S. Application Data

[63] Continuation of Ser. No. 237,566, March 23, 1972, abandoned, which is a continuation of Ser. No. 875,657, Nov. 12, 1969, abandoned.

[52] U.S. Cl. ............................... 204/298; 204/192
[51] Int. Cl.² ............................................ C23c 15/00
[58] Field of Search ........................... 204/192, 298

[56] References Cited
UNITED STATES PATENTS

| | | | |
|---|---|---|---|
| 3,121,852 | 2/1964 | Boyd et al. | 204/192 |
| 3,233,137 | 2/1966 | Anderson et al. | 204/192 |
| 3,388,053 | 6/1968 | Sinclair et al. | 204/298 |
| 3,528,906 | 9/1970 | Cash et al. | 204/298 |
| 3,558,467 | 1/1971 | Jackson | 204/298 |
| 3,652,444 | 2/1972 | Lester et al. | 204/298 |
| 3,677,924 | 7/1972 | Cash et al. | 204/192 |

OTHER PUBLICATIONS

Davidse, "Theory and Practice of RF Sputtering," Vacuum, Vol. 17, No. 3, p. 142, Mar. 1967.

*Primary Examiner*—John H. Mack
*Assistant Examiner*—Wayne A. Langel
*Attorney, Agent, or Firm*—Stanley Z. Cole; Leon F. Herbert

[57] ABSTRACT

A gaseous discharge sputter coating apparatus is described for sequentially sputtering different materials onto discrete batches of substrate objects. The apparatus includes a chamber defining a controlled environment capable of sustaining a gaseous discharge, a table within the chamber for supporting separate batches of substrate objects, and means for sustaining a gaseous discharge within the chamber. A plurality of target electrode structures is also provided, each of which has a surface in the chamber which has a layer on it of one of the materials desired to be coated onto the substrate objects. The target electrode structures are part of the wall of the controlled environment chamber, and each includes an insulating material separating it from the remainder of the wall. In order to obviate the necessity of including a ground shield around each of the target electrodes, only that portion of the electrode within the chamber having the material on it has power applied to it to cause the sputtering. The target electrode structures are detachably secured to the remaining portion of the wall so that they may be removed for servicing.

8 Claims, 4 Drawing Figures

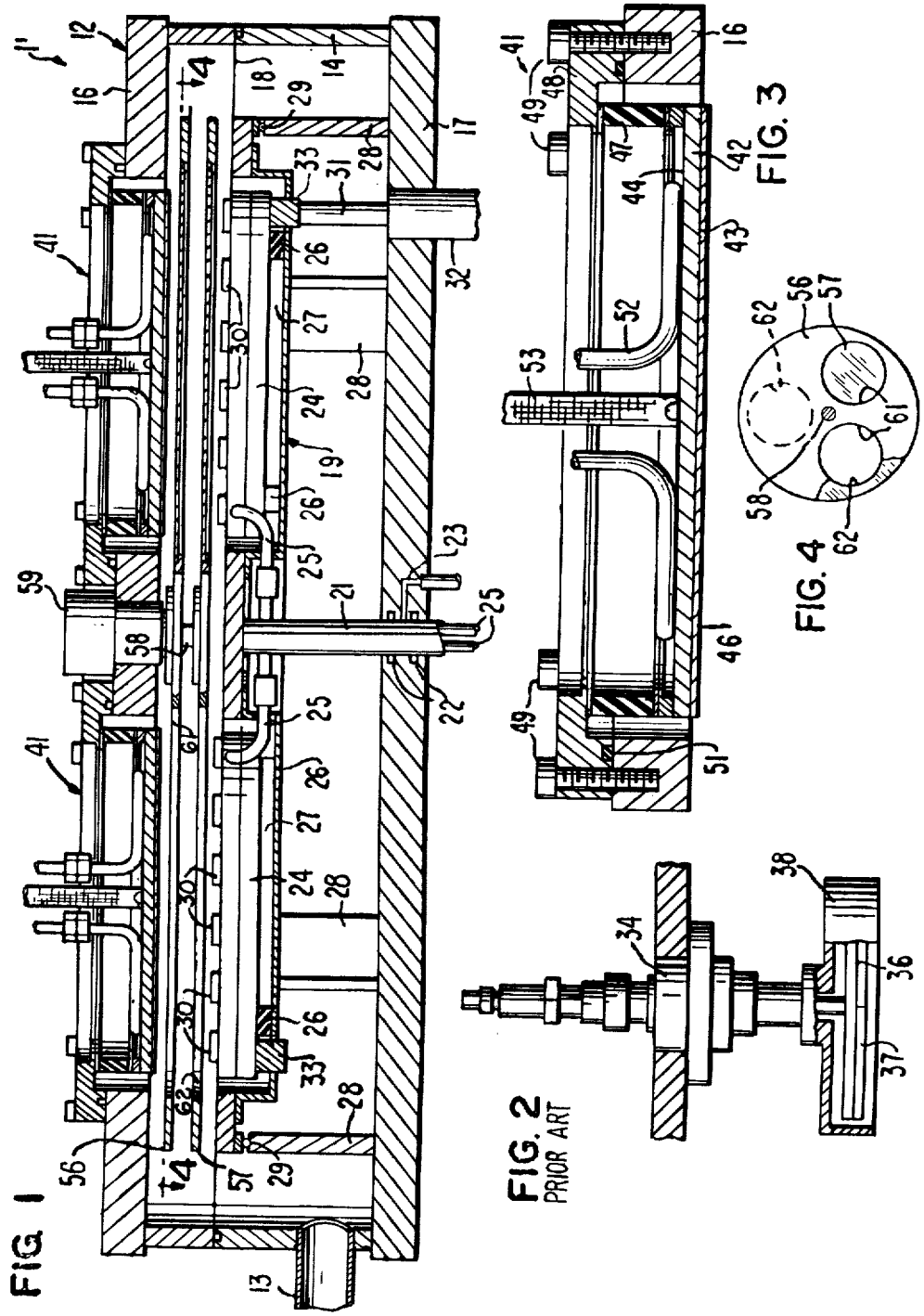

SPUTTER COATING APPARATUS HAVING IMPROVED TARGET ELECTRODE STRUCTURE

This is a continuation of application Ser. No. 237,566 filed Mar. 23, 1972, now abandoned, which is a continuation of application Ser. No. 875,657 filed on Nov. 12, 1969, now abandoned.

BACKGROUND OF THE INVENTION

This invention relates to a gaseous discharge sputter coating apparatus having an improved target electrode structure which simplifies the construction and use of the apparatus and which is not subject to capacitive losses as are prior art structures.

It is necessary for many purposes to coat objects with one or more thin film of material. For example, most microelectronic components are produced by the application of thin films of conducting or semiconducting material onto a substrate surface. One of the primary types of apparatus used to apply such thin films relies on the sputtering phenomenon to provide the coating. That is, a target of the selected coating material is bombarded with high energy positive ions to effect removal of particles of the coated material from the target. The removed particles then deposit onto and adhere to substrate objects disposed in the line-of-sight of the bombarded target. The desired thin film is thus produced by the build-up on the substrate of the deposited particles.

The target sputtering and the deposition is most often obtained by forming a gaseous discharge between the target and an electrode such as the support for the substrate objects. Usually, the gaseous discharge is initiated and sustained by applying high frequency, e.g., radio frequency, electrical energy to the target or the other electrode structure. Samples of sputtering apparatuses of this type can be found in U.S. patent applications Ser. No. 625,733 filed Mar. 24, 1967, now abandoned; Ser. No. 662,637 filed Aug. 23, 1967, now abandoned; Ser. No. 668,107 filed Sept. 15, 1967, now U.S. Pat. No. 3,537,973; and Ser. No. 674,539 filed Oct. 11, 1967, now abandoned.

The target electrode structure for such an arrangement is usually in the form of a plate having a layer of the desired coating material on one face thereof. The plate is suspended within a chamber which encloses the substrate objects and which defines a controlled high vacuum environment for the gaseous discharge sputtering. It has been necessary in the past to include a grounding shield surrounding all surfaces of the plate, except for the face having the coating material, in order to confine the gaseous discharge to such face. If a grounding shield is not provided in prior art structures, sputtering of materials from surfaces of the electrode other than the surface having the desired material will occur. This will result in contamination of the coating applied to the substrate.

In order to be effective to prevent the formation of a gaseous discharge at surfaces of the target not made from the desired coating material, the grounding shield must be fairly closely spaced to the electrode. This results in capacitance between the electrode and the shielding, with resulting high power losses and, at times, arcing. Thus the intensity of the gaseous discharge and the desired sputtering is limited by such shields.

Other disadvantages are inherent in present systems in view of the necessity of locating the target electrode within a high vacuum chamber having a controlled environment to support the gaseous discharge. That is, relatively complicated electrical feed-through and cooling mechanisms must be provided through the wall of the vacuum chamber in order to connect the target electrode with electrical cooling medium sources exterior to such chamber. These complicated mechanisms are expensive and quite space consuming.

SUMMARY OF THE INVENTION

It is an object of the present invention to provide a coating apparatus of the sputtering type which has a target electrode structure not subject to the above difficulties and disadvantages. In its basic aspects, the invention is a coating apparatus having a target electrode structure which itself is a part of the wall of the vacuum chamber defining the controlled environment for the sputtering and which includes a portion which is outside the chamber. With this construction, the electrode can be designed so that the only portion within the chamber from which sputtering can take place is that surface on which the desired material is bonded. Thus, it is no longer necessary to include a ground plane surrounding the other portions of the electrode structure to prevent unwanted sputtering from such portions. Capacitive losses and arcing with their consequent limitations are thereby avoided. Moreover, with such a construction, feed-through mechanisms for applying electrical energy to the electrode and for providing cooling of such electrode are no longer necessary. The power can be directly applied to the portion of the electrode which is outside of the chamber as long as such portion is in an electrical conducting relationship with the target electrode surface within the chamber. Cooling coils can also be used exterior of the vacuum chamber to conduct heat from the portion of the electrode which is outside of the controlled environment to thereby also cool the electrode sputtering surface inside the chamber.

Other features and advantages of the instant invention will become apparent from the following more detailed description.

BRIEF DESCRIPTION OF THE DRAWING

FIG. 1 is a sectional view of a preferred embodiment of a coating apparatus of the invention;

FIG. 2 is a partial sectional view of a typical target electrode structure utilized in prior art coating apparatuses;

FIG. 3 is an enlarged sectional view illustrating the target electrode structure of the instant invention; and FIG. 4 is a reduced plan view taken on a plane indicated by the lines 4—4 in FIG. 1 illustrating the shutter arrangement of the coating apparatuses of the instant invention.

DETAILED DESCRIPTION OF THE EMBODIMENT

FIG. 1 illustrates in section a preferred coating apparatus of the invention which can be used to sequentially sputter different materials onto substrate objects, such as microcircuitry wafers. That is, the apparatus, generally referred to by the reference numeral 11, can be used to sequentially apply several layers of different materials to substrate objects without the necessity of access being had to the interior of the chamber between the deposition of the different layers. Such apparatus includes an outer vacuum chamber 12 for containing a controlled environment for the formation of a gaseous discharge to obtain the desired sputtering. As is conventional, a vacuum exhaust port 13 communicates the chamber with a vacuum system for evacuating such chamber. Means (not shown) are also included for introducing a low pressure gas into the chamber to provide a controlled gas background for the formation of gaseous discharges. In accordance with conventional practice, the gas generally is an inert gas such as argon, but may include other gases if reactive sputtering is desired.

Vacuum chamber 12 is formed by a cylindrical side wall 14 and top and bottom discular end walls 16 and 17, respectively. The upper and lower portions of chamber 12 are separable from one another along lateral joint 18 so that access can be had to the interior of the chamber for maintenance and for the insertion and removal of substrate objects to be coated.

Means are provided within the chamber for supporting at discrete locations therein a plurality of substrate objects to be coated. More particularly, a disc-shaped table 19 is located within the chamber axially mounted on a shaft 21. As illustrated, shaft 21 extends through bottom wall 17 of chamber 12 via a rotary motion vacuum feedthrough diagrammatically illustrated by bearings 22 and guard vacuum exhaust bore 23. Rotation of shaft 21 exterior to the chamber will rotate table 19 within the chamber, as is desirable for reasons which will become clear hereinafter.

Table 19 includes an annular ground electrode structure 24 which is supported by blocks 26 of an electrical insulating material within an annular cavity 27 in the upper surface of such table 19. The perimeter of the table is supported by uprights 28 which extend upwardly at spaced locations within the chamber from its bottom wall 17. A ball bearing 29 between each upright 28 and table 19 permits rotation of the table with respect to the uprights.

Annular electrode structure 24 is adapted to support at discrete locations on its upper surface batches of substrate objects 30 to be coated. In this embodiment, such electrode structure also acts as one of the electrodes by which the desired gaseous discharges are maintained within the vacuum chamber. Means are provided for cooling electrode 24. For this purpose, inlet and outlet cooling medium tubes 25 extend through shaft 21 and to suitable coolant passages (not shown) in the body of the electrode.

Before the coating of many substrate objects, it is desirable to be able to clean the surfaces thereof to be coated by first sputtering the contaminated surface material from the object. Thus, it is desirable to be able to apply high frequency electrical energy to the annular electrode structure 24 and thereby cause it and the substrate objects to act as a target electrode from which sputtering will occur. Means are therefore included for applying the high frequency electrical energy to electrode 24. More particularly, a suitably insulated conducting post 31 extends upwardly into chamber 12 through bottom end wall 17 via vacuum electrical feedthrough, schematically illustrated at 32. Post 31 terminates at a location adjacent the peripheral edge of structure 24, and a plurality of electrode blocks 33 project downwardly from the underneath surface of electrode 24 for selective engagement with such post. Contact blocks 33 are spaced about the periphery of electrode 24 so that one of the same will be in engagement with post 31 whenever the substrates 30 are aligned with a target electrode structure.

As a particularly salient feature of the instant invention, it includes target electrode structures which not only act as sources of the desired coating materials, but also define parts of the wall of the chamber and have portions outside the control environment of such chamber. This is in contrast to conventional target electrode structures, a typical one of which is illustrated in FIG. 2. Such prior art target electrode structures have included a relatively complicated vacuum feedthrough 34 for directing both a cooling medium such as water and electrical energy to the target electrode 36. It has been necessary with prior art structures to include a ground shield 38 surrounding all surfaces of the electrode structure not having a layer 37 of the desired coating material. This grounding shield is provided for the purpose of confining the gaseous discharge to the face having the layer 37 so that sputtering does not occur on other surfaces of the electrode and cause contamination of the coating applied to the substrate. In order for the grounding shield 38 to be effective for this purpose, it must be fairly closely spaced to the electrode 36. The result is that capacitance is built up between the electrode and the shielding, with resulting high power losses and at times arcing. In the past therefore the intensity of the gaseous discharge and the consequential sputtering of the desired material has been severely limited by the necessity of such shield.

Because the target electrode structures incorporated into the invention, each of which is generally referred to by the reference numeral 41, are parts of the wall defining the vacuum chamber 12, as well as for other reasons, they are not subject to the disadvantages inherent in the prior art electrode structures. In this connection, each target electrode structure 41 includes an electrical and heat conducting discular plate having a first side or base 43 within the chamber and an opposite face 44 exterior to the controlled environment of the chamber. A layer 46 of the desired coating material is suitably bonded to plate 42 and covers the full face 43 thereof.

Means are provided for electrically insulating the plate 42 of each target electrode from the remaining wall portion of chamber 12. That is, a cylindrical rim 47 of an insulating material, such as a ceramic, is secured to face 44 of each plate 42 at its perimeter. An annular flange 48 extends outwardly from the upper end of rim 47 for the securance of the respective target electrode structures to the usual wall structure of the chamber. Such flange is detachably secured to the wall 16 of the chamber so that the electrode structure may be selectively removed from the chamber to facilitate access to the face 43 thereof and the layer of material 46. More particularly, a plurality of spaced apart bolts 49 pass through flange 48 and are received within tapped bores in the wall 16. Sealing means in the form of O rings 51 hermetically seal the flanges 48 to wall 16 about the periphery of the apertures through which the respective target electrodes extend.

It will be appreciated from the above that a grounding shield is not needed with the target electrode structure of the invention. This is because the only electrified portion of the target electrode structure which is within the controlled environment and can support a glow discharge is the face 43 thereof having the layer 46. Thus, no ground shield is necessary to prevent the formation of a gaseous discharge from other surfaces of the target electrode structure. The result is that the capacitance and electrical losses associated with a shield are avoided.

It should be noted that essentially all of the plate 42 to be energized of each target electrode is spaced from all other electrical conducting portions of the wall defining the chamber so that electrical losses from the plate to the remainder of the chamber wall are minimized. The only location at which there is any close spacing between the plate 42 and the wall of the chamber is at the peripheral edge of the plate. The amount of capacitance which can build up in this minimal surface is inconsequential. However, if it is desired to even eliminate this amount, it is only necessary to axially elongate the ceramic rim 47 in order to space the plate 43 further into the interior of the chamber and thus further from the wall 16.

The fact that each target electrode structure 41 is removable from the chamber is an important advantage of the structure. When it is desired to substitute one coating material for another, it is merely necessary to replace one of the target electrode structures with another having the desired coating material. Moreover, the application of the layer of coating material to the face of the target electrode structure may be easily accomplished once the electrode is separated by removal from the remainder of the coating apparatus. In contrast, with prior art target electrode structures, such as that shown in FIG. 2, it has been necessary to apply a coating on a separate, removable plate which is then secured to the target electrode by means of a bolt, or the like. This intermediate separate piece has limited both the electrical and heat conductance between the target electrode structure and the layer of coating material.

Another major advantage of the apparatus of the invention is that the target electrode plate can be both cooled and energized from the exterior of the chamber. That is, in order to cool the surface 44 of the plate and, thus, the bombarded surface 46 thereof, a tube 52 for the passage of a cooling medium is coiled in good heat conducting relationship onto the surface 44. In order to apply electrical energy to the plate, a high frequency electrical lead 53 may also be simply secured to the surface 44 of the plate 42.

As mentioned before, the apparatus of the invention is usable to sequentially sputter different materials onto a plurality of substrate objects located at discrete locations on the table electrode 24. For this purpose, each of the target electrode structures 41 has a layer 46 of a different one of the desired materials. By rotating table 19 by means of shaft 21, the substrate objects at any discrete location on the electrode 24 can be brought into registery or alignment with the target electrode having the material with which it is desired to coat such objects. In this connection, means are provided for confining the gaseous discharge within the chamber to sputter material from only the selected one of the targets. More particularly, a shutter arrangement made up of a pair of spaced upper and lower discular plates 56 and 57, respectively, are disposed between the target electrodes and the substrate object. Both of the plates 56 and 57 are axially mounted upon a shaft 58 which extends upwardly through a suitable rotary vacuum feedthrough 59 to the exterior of the chamber for actuation.

As is best illustrated in FIG. 4, each of the plates 56 and 57 is provided with a pair of apertures 61 and 62, respectively. One of the apertures 61 is aligned with one of the apertures 62 to permit passage through the shutter arrangement of material sputtered from any selected one of the target electrodes to substrates on the table at a location directly therebeneath. The second aperture 61 of shutter 56 overlies a solid portion of shutter 57, and is provided to enable "sputter cleaning" of any one of the target electrode structures by permitting sputtering from such target electrode onto the shutter 57. The other aperture 62 in the lower shutter 57 is for the purpose of allowing sputter cleaning from the substrate objects onto the upper shutter by applying electrical energy to the table electrode 24 as previously described. It will be appreciated that the shutter arrangement can be rotated exterior to the chamber by shaft 58 to align any selected one of the aperture arrangements with any selected one of the target electrode structures to enable the desired sputtering mode.

It should be appreciated from the above that making the target electrode a part of the wall of the chamber defining the controlled environment for sputtering provides many advantageous results. And although the invention has been described with respect to a preferred embodiment thereof, it will be apparent to those skilled in the art that many changes and alterations can be made within the spirit and scope of the invention as defined by the claims.

What is claimed is:

1. In a coating apparatus for sputtering material from a target electrode structure by a gaseous discharge for deposition onto a substrate surface, comprising a chamber defining a controlled environment for said sputtering and deposition, a target electrode structure having a surface within said chamber of the material to be sputtered, means within said chamber for supporting a substrate object at a location for deposition thereon of said material, and means for initiating and sustaining a gaseous discharge within said chamber to sputter said material from said target electrode structure for deposition onto said substrate object; THE IMPROVEMENT WHEREIN said target electrode structure comprises a metallic target electrode plate having an inner surface facing the interior of said chamber and an outer surface facing outwardly of said chamber, said chamber having a metallic wall portion adjacent said target electrode structure and having an aperture in said wall portion, a tubular dielectric member having one end hermetically sealed to said target electrode plate adjacent the periphery of said target electrode plate, the other end of said tubular dielectric member having a hermetic seal connection to said wall portion, said aperture being large enough to permit said target electrode plate and said tubular dielectric member to be inserted through the aperture from the outside of said chamber, and the inner surface of said target electrode plate being positioned inside said chamber whereby the inner surface of said target electrode plate can be covered with either dielectric or metallic sputter material, the inner surface of said target electrode plate extending into said chamber no further than to the position at which said inner surface of said target plate is substantially coplanar with the inner surface of said adjacent wall portion of said chamber, and said adjacent wall portion of said chamber being closely adjacent the periphery of said target electrode plate to prevent sputtering from the periphery of said target electrode plate.

2. A coating apparatus as claimed in claim 1 in which said hermetic seal connection between said tubular member and said wall portion comprises a metallic flange removably sealed to the outside of said wall portion and a hermetic seal between said tubular member and said flange.

3. A coating apparatus as claimed in claim 2 in which the inside dimension of said metallic flange is substantially no less than the inside dimension of said tubular dielectric member, whereby electrical losses are minimized because metallic portions of the apparatus which are at the potential of the chamber and face the outer surface of the target electrode plate are minimized.

4. A coating apparatus as claimed in claim 1 in which said target electrode plate extends into said aperture to a position at which the inner surface of said target electrode plate is substantially coplanar with the interior surface of said wall portion adjacent said aperture.

5. A coating apparatus as claimed in claim 1 in which cooling means are associated with said outer surface of said target electrode plate, and said cooling means are located entirely outside said controlled environment of said chamber.

6. In a coating apparatus for sputtering material from a target electrode structure by a gaseous discharge for deposition onto a substrate surface, comprising a chamber defining a controlled environment for said sputtering and deposition, a target electrode structure having a surface within said chamber of the material to be sputtered, means within said chamber for supporting a substrate object at a location for deposition thereon of said material, and means for initiating and sustaining a gaseous discharge within said chamber to sputter said material from said target electrode structure for deposition onto said substrate object; the improvement wherein said target electrode structure comprises a metallic target electrode plate having an inner surface facing the interior of said chamber, said chamber having a metallic wall portion adjacent said target electrode structure and having an aperture in said wall portion, hermetic sealing and support means interposed between said target electrode plate and the outside of said wall portion for supporting said target electrode plate from the outside of said chamber, said sealing and support means being detachably sealed to the outer surface of the chamber wall portion around said aperture, said sealing and support means including insulating means electrically separating said target electrode plate from said chamber, said aperture in said chamber wall portion being large enough to permit said target electrode plate to be inserted through the aperture from the outside of said chamber, and the inner surface of said target electrode plate being positioned within the atmosphere inside said chamber whereby the inner surface of said target electrode plate can be covered with either dielectric or metallic sputter material.

7. A coating apparatus as in claim 6 in which said inner surface of said target electrode plate extends into said chamber no further than to the position at which said inner surface of said target plate is substantially coplanar with the inner surface of said adjacent wall portion of said chamber, and said adjacent wall portion of said chamber is closely adjacent the periphery of said target electrode plate to prevent sputtering from the periphery of said target electrode plate.

8. In a coating apparatus for sputtering material from a target electrode structure by a gaseous discharge for deposition onto a substrate surface, comprising a chamber defining a controlled environment for said sputtering and deposition, a target electrode structure having a surface within said chamber of the material to be sputtered, means within said chamber for supporting a substrate object at a location for deposition thereon of said material, and means for initiating and sustaining a gaseous discharge within said chamber to sputter said material from said target electrode structure for deposition onto said substrate object; THE IMPROVEMENT WHEREIN said target electrode structure comprises a metallic target electrode plate having an inner surface facing the interior of said chamber, said chamber having a metallic wall adjacent said target electrode structure and having an aperture in said wall, hermetic sealing and support means interposed between said target electrode plate and said wall, said sealing and support means being sealed to said chamber wall around said aperture, said sealing and support means including insulating means electrically separating said target electrode plate from said chamber, said aperture being at least as large as said target electrode plate, said target electrode plate being positioned in registry with said aperture so said target electrode plate does not overlap said chamber wall around said aperture, and the inner surface of said target electrode plate being positioned within the atmosphere inside said chamber whereby the inner surface of said target electrode plate can be covered with either dielectric or metallic sputter material.

* * * * *